United States Patent
Dunaway et al.

[11] Patent Number: 5,101,550
[45] Date of Patent: Apr. 7, 1992

[54] REMOVABLE DROP-THROUGH DIE BOND FRAME

[75] Inventors: Thomas J. Dunaway, St. Louis Park; Richard K. Spielberger, Maple Grove; Lori A. Dicks, New Hope, all of Minn.

[73] Assignee: Honeywell Inc., Minneapolis, Minn.

[21] Appl. No.: 736,008

[22] Filed: Jul. 25, 1991

Related U.S. Application Data

[62] Division of Ser. No. 607,246, Oct. 31, 1990, Pat. No. 5,074,036, which is a division of Ser. No. 309,425, Feb. 10, 1989, Pat. No. 4,979,289.

[51] Int. Cl.5 .............................................. B23P 19/04
[52] U.S. Cl. ........................................ 29/760; 29/758; 29/759
[58] Field of Search ................. 29/827, 832, 834, 848, 29/850, 852, 739, 740, 741, 758, 759, 760; 72/360; 357/70, 72, 74, 75, 80, 81; 368/84, 239; 437/206, 207, 209, 211, 220

[56] References Cited

U.S. PATENT DOCUMENTS

| | | | |
|---|---|---|---|
| 3,458,780 | 7/1969 | McDaniel | 29/827 X |
| 3,695,502 | 10/1972 | Gaiser | 29/834 X |
| 3,780,429 | 12/1973 | Friebel et al. | 29/827 X |
| 3,846,907 | 11/1974 | Ivanovic | 29/834 X |
| 3,982,979 | 9/1976 | Hentz et al. | 29/834 X |
| 4,025,715 | 5/1977 | Morse | 357/70 X |
| 4,079,511 | 3/1978 | Grabbe | 357/70 X |
| 4,139,726 | 2/1979 | Penrod et al. | 357/74 X |
| 4,408,218 | 10/1983 | Grabbe | 357/70 |
| 4,670,770 | 6/1987 | Tai | 357/75 X |
| 4,685,606 | 9/1987 | Flint et al. | 72/360 X |
| 4,763,407 | 8/1988 | Abe | 29/827 |

OTHER PUBLICATIONS

IBM Technical Disclosure Bulletin, vol. 28, No. 5, pp. 2237-2238, Oct. 1985.

Primary Examiner—Joseph M. Gorski
Assistant Examiner—Peter Dungba Vo
Attorney, Agent, or Firm—John P. Sumner

[57] ABSTRACT

A method and apparatus for accurately positioning a semiconductor chip onto a die bond pad region of a semiconductor package. A frame is constructed for slidable contact with peripheral walls of a semiconductor package die cavity. A frame central aperture with a wide upper opening and a narrower lower opening guides a semiconductor chip dropped therethrough into a precise position in the die cavity.

8 Claims, 5 Drawing Sheets

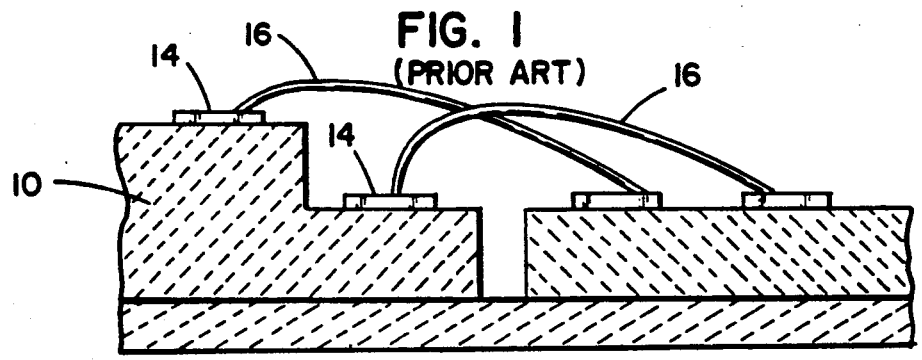
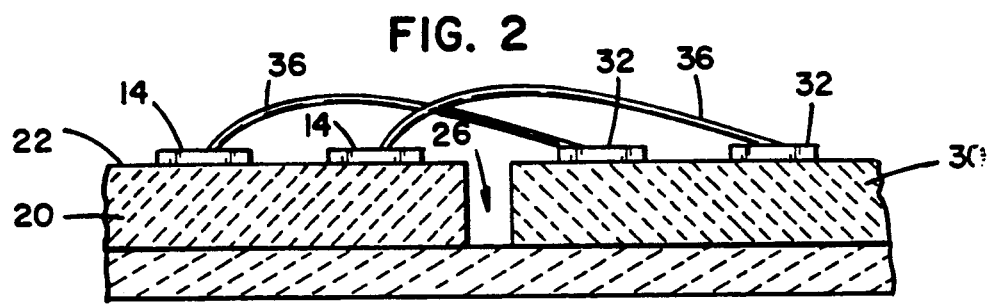
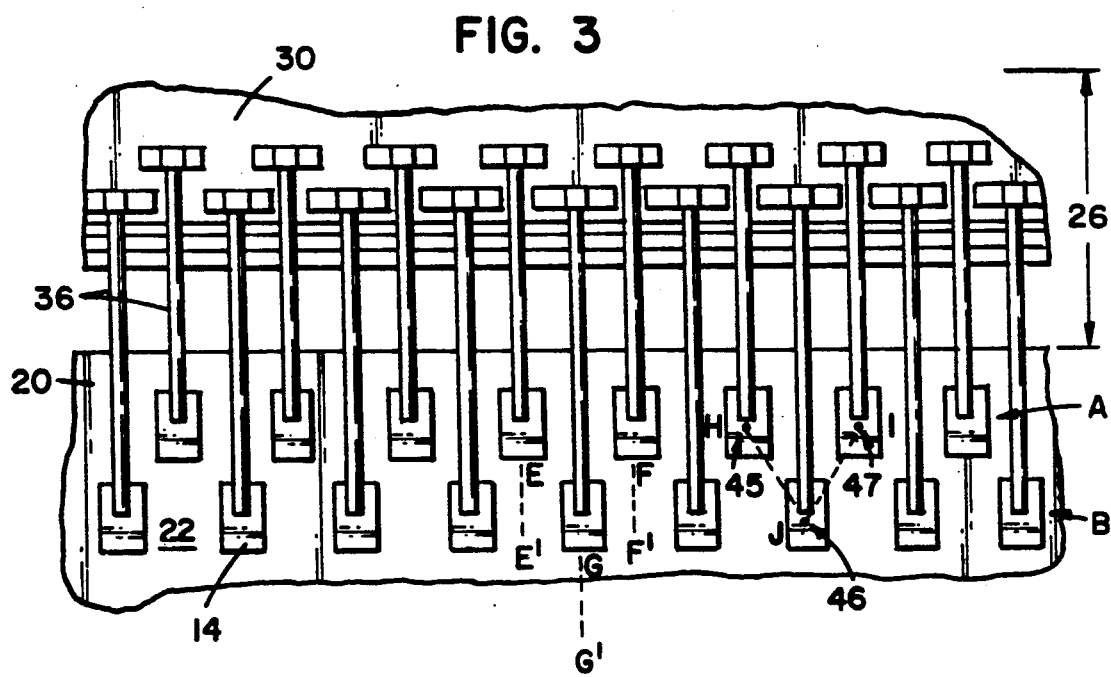

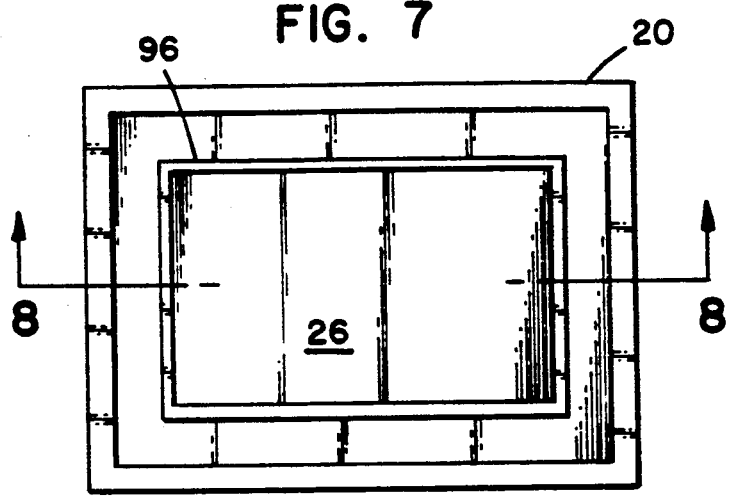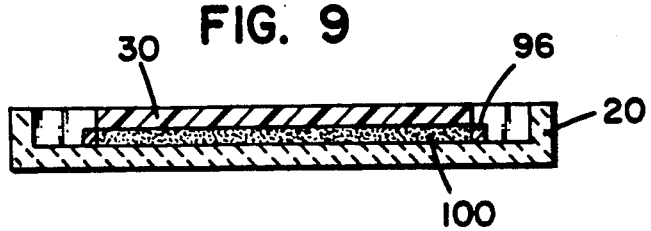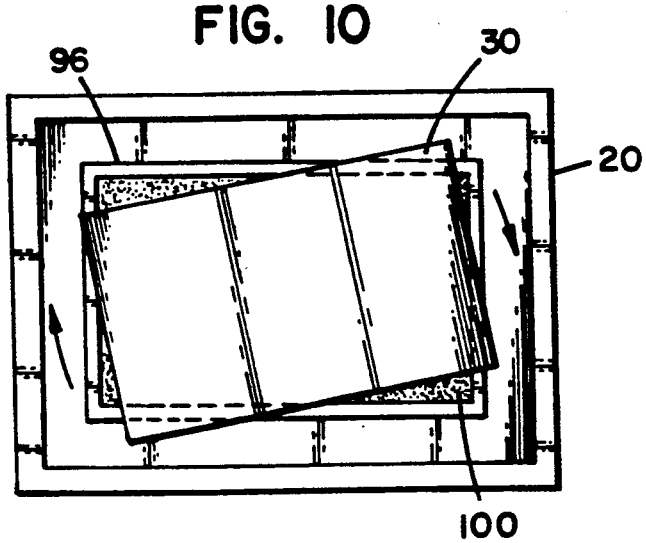

REMOVABLE DROP-THROUGH DIE BOND FRAME

This is a division of application Ser. No. 07/607,246, filed Oct. 31, 1990, U.S. Pat. No. 5074036, which is a division of application Ser. No. 07/309,425, filed Feb. 10, 1989, now U.S. Pat. No. 4,979,289.

TECHNICAL FIELD OF THE INVENTION

The present invention relates generally to semiconductor chip packaging and more particularly to a frame for accurately positioning a semiconductor onto a die bond pad region of a semiconductor package.

BACKGROUND OF THE INVENTION

Within the field of semiconductor chip packaging numerous problems exist. One problem area in particular relates to yield loss due to damage of semiconductor chips during bonding to ceramic packages. This problem occurs in part due to rigid connections between ceramic packaging and silicon chips. Such rigid connections are particularly vulnerable as chip size increases. This vulnerability results from the thermal expansion mismatch between bonded materials, and it produces cracked chips or mechanical breaks in the die bond region. Large chips having sides greater than 400 mils in length are quite susceptible to this problem. As a result, it is common practice within the semiconductor chip processing and packaging industries to discourage use of bonding materials which may contribute to the overall effects of thermal stress. For example, certain bonding materials are quite rigid and do not provide stress relief between the ceramic package and a silicon chip during the heating process. Other bonding materials comprise organic material, which in some environments is unacceptable for use. Further, one of the most common bonding materials requires very high cure temperatures which, in addition to causing heat stress to delicate semiconductor chip components during the bonding process, frequently results in actual melting of a bottom portion of the chip. This melting of the bottom portion of the chip forms a weld connection with part of the die bond. This common bonding material, gold-silicon eutectic, also generates out-gassing or air bubbles during the bonding process, as well as producing moisture which may lead to other complications in the manufacturing process.

Other bonding materials also exhibit undesirable qualities for use as a die bond bonding material. For example, use of epoxy-type bonding material often results in bleedout of rosin from the bonding material during the bonding process. This bleedout results in contamination of bonding surfaces and contributes to insufficient bonding at bonding points other than at the die bond. Commonly, this bleedout phenomenon is caused by a mounted semiconductor chip being pressed down into the bonding material at the die bond region by mechanical means. The mechanical means is typically a collet or similar apparatus which grips a top or side portion of the semiconductor chip and oscillates the chip by mechanical movement in contact with the bonding material. This movement, commonly referred to as scrubbing, is designed to remove the oxides from the bonding material. Mechanical damage results when a scrubbing apparatus cracks, crushes, or chips the semiconductor chip during the scrubbing action. Yet another problem related to mechanical scrubbing during die bonding is the inaccurate final placement of the chip with respect to the die bond region. This lack of precision precludes the effective use of this die bonding technique when die bonding high-density semiconductor chips to certain packages.

Another problem relating to semiconductor chip packaging is the problem of manufacturing a semiconductor chip package bond pad design which matches the pitch and density of a semiconductor chip mounted therein. Heretofore, the package bond pad pitch has been limited by wire bond tool width. As a result, the pitch of outer lead bonds on packages has differed substantially from the pitch of the chip bond sites. When combined with prior inabilities to precisely and efficiently locate and bond the chip in the die bond pad region, multiple inefficiencies in chip manufacture have resulted.

What has been needed therefore has been improved package designs for minimizing production inefficiencies such as pitch mismatch, multiple tier designs, and chip positioning imprecision which have been heretofore not sufficiently solved.

What has been further needed has been an improved high-density bond pad design for a semiconductor chip package.

What has been further needed has been a drop-through die bond process for accurately positioning a semiconductor chip onto a die bond pad region without damaging the chip.

What has been further needed has been a reflow aligned die bond process for providing low cost and high-accuracy die bonding of a semiconductor chip to a semiconductor chip package.

Objects and advantages of the present invention in achieving these and other goals will become apparent from the following descriptions, taken in connection with the accompanying drawings. Wherein are set forth by way of illustration and example certain embodiments of the present invention.

SUMMARY OF THE INVENTION

An apparatus and method is provided for accurately positioning a semiconductor chip onto a die bond pad region of a semiconductor package. The apparatus consists of a frame comprising top and bottom surfaces, and outer section and an inner section. The outer section is constructed and arranged for substantially slidable contact with peripheral walls of a semiconductor package die cavity. The inner section defines a central aperture extending through the frame. Also, the inner section preferably comprises sloped walls defining a wide upper opening and a narrower lower opening for guiding a semiconductor chip into a precise position with respect to the package die cavity when the frame is placed in the die cavity and the chip is dropped through the frame central aperture.

BRIEF DESCRIPTION OF THE DRAWINGS

FIG. 1 is a side cross sectional illustration of a prior art two tier semiconductor chip package comprising bonding pads on each tier connected to a semiconductor chip.

FIG. 2 is a side cross sectional illustration of a single tier semiconductor chip package consistent with the present invention.

FIG. 3 is a top plan fragmentary view of a high density bond pad design according to the present invention showing a double row of staggered single tier bonding pads on a semiconductor chip package for connection with chip bonding pads using uniformly lengthed wire bonds.

FIG. 7 is a top plan view of a semiconductor chip package having a chip mounting region comprising a die bond pad and a ridge of material surrounding the die bond pad.

FIG. 8 is a side cross sectional view corresponding generally to lines 8—8 of FIG. 7.

FIG. 9 is a side cross sectional view of a semiconductor chip package according to the present invention having a layer of solder and a chip configured in aligned contact with the solder and a solder damming ridge.

FIG. 10 is a top plan view illustrating a misaligned semiconductor chip being aligned by the surface tension of the dammed solder material located within the chip mounting region ridge of a semiconductor chip package generally analogous to that shown in FIGS. 7-9.

DETAILED DESCRIPTION OF THE INVENTION

Figure 4:
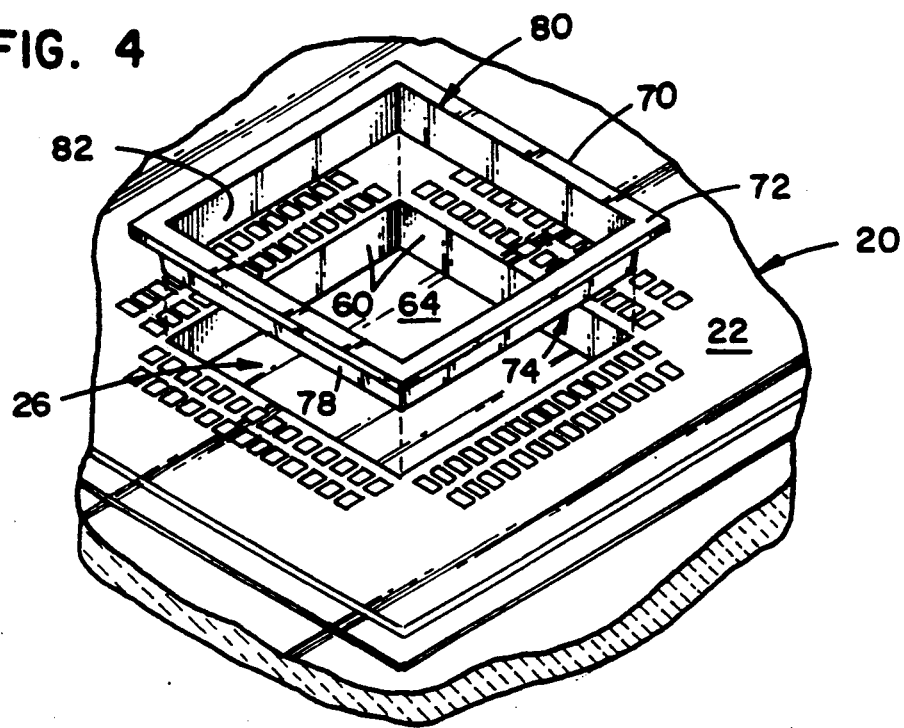
FIG. 4 is a perspective environmental illustration of a drop-through die bond frame arranged for placement in a semiconductor package die cavity.

As required, detailed embodiments of the present invention are disclosed herein. It is to be understood however, that the disclosed embodiments are merely exemplary of the invention, which may be embodied in various forms. Therefore, specific structural and functional details disclosed herein are not to be interpreted as limiting, but rather as a basis for teaching one skilled in the art to variously employ the present invention in virtually any appropriately detailed system or structure.

Referring to FIG. 1, a representative prior art semiconductor chip package bond pad configuration is shown. Prior art semiconductor package 10 is shown having a double tier arrangement for placement of bond pads 14 on each tier. Substantial production and testing inefficiencies often occurs from use of these prior art double tier bond pad configurations. For example, as shown in FIG. 1, conventional bond pads arranged in double tiers require wire bond wires 16, shown extending between bonding pads on the package and the chip, which comprise wires having different lengths. Non-uniform wire lengths may be less efficient to assemble in a chip package than uniformly lengthed wires. Also, double tier bond pad configurations produce non-uniform spacing between wire bond wires which contributes to unreliable electrical performance of the assembled chip and package. Accordingly, it is desirable to provide a semiconductor chip package bond pad configuration which provides uniform wire bond pitch spacing and use of uniformly lengthed wires between bond pads. It is also desirable to provide bond pads on a single tier of a package to enhance the overall pitch characteristics and reliability of the package, as well as to enhance production efficiencies.

FIG. 2 illustrates a semiconductor chip package 20 according to the present invention comprising a top surface 22 having a recessed chip carrying cavity 26. Chip carrying cavity 26 may also be referred to as a central chip receiving area or a package die bond pad region. Top surface 22 comprises bonding pads 14 arranged in a single tier pattern. As illustrated, recessed chip carrying cavity 26 contains a representative semiconductor chip 30 with chip bond pads 32. FIG. 2 further illustrates preferred wire bond wires 36 comprising wires of uniform length. Wires 36 provide electrical connection between package bond pads 14 and chip bond pads 32. As will be further discussed below, this combination of uniformly lengthed single tier wire bond wires for bonding semiconductor chip packages permits manufacturing efficiencies not previously enjoyed in the art. Also, this single tier construction enhances tape automated bonding or leadframe techniques for electrically interconnecting package and chip bonding sites.

FIG. 3 is a top view of a section of a semiconductor chip package 20 shown with wire bond wires 36 providing electrical connection to chip 30. Package 20 is shown with chip 30 located in central chip receiving cavity 26, and with a first row of wire bond pads, labelled A, located adjacent and peripheral to the central chip receiving cavity on package top surface 22. A second row of wire bond pads, labelled B, is located further away from central chip receiving cavity 26 than the first row of pads. As shown in FIGS. 2 and 3, both the first and the second row of package wire bond pads are on the same planar surface of package top surface 22. Moreover, as represented by the package bonding pads labelled E, F, and G, a preferred high density bond pad configuration is shown. Preferably, each wire bond pad 14 is characterized by a central longitudinal axis, such as axes E', F', and G'. The arrangement of preferred high density bonding pads 14 thus comprises the axis of a wire or leadframe bond pad in one of the first or second rows passing substantially centrally between two wire bond pad axes in the other row.

Another manner of expressing the relationship of preferred high density bond pads 14 is also illustrated in FIG. 3. As shown, each package bond pad 14 (also known individually as an outer lead bond pad) comprises a center of symmetry so that lines drawn from the center of symmetry of two adjacent bond pads, such as pads labelled H and I, of the first row to the center of symmetry of the interstitially related second row bond pad, such as the pad labelled J, are of equal length. Here, centers of symmetry 44 and 45 of the adjacent first row bond pads form points for connection of shadow lines with the center of symmetry 46 located on the second row bond pad which is interstitial to the first row pads. Lines 44-46 and 45-46 are thus of equal length.

Yet another way of expressing the present high density bond pad invention is to provide a semiconductor chip package 20, as depicted in FIG. 3, having a top surface 22 comprising a recessed chip carrying cavity 26, and a double row of staggered single tier bond pads 14 placed around cavity 26. A preferred bond pad configuration permits use of wire bond wires of uniform length and which provide a high density pitch arrangement. Indeed, a preferred high density bond pad configuration comprises package bond pads 14 having an effective pitch of about 3 mils between adjacent pads. This is achievable due to the staggered double row configuration which allows very close spacing of adjacent bond pads in each row, resulting in an effective pitch which is narrower than could be otherwise normally achieved with non-staggered pads due to bond pad footprint space limitations.

A further advantage of the preferred high density bond pad configuration described above is achieved by maintaining the wire bond wires in substantially non-crossing relation. This provides means for minimizing any electrical interference or cross-talk between wires in close proximity and allows greater manufacturing and repair efficiencies. Accordingly, a semiconductor chip package is provided with a plurality of bond pads located on the same plane about a chip receiving cavity. The bond pads 14 are arranged in a pattern comprising means for meeting the wire crossing prohibition of U.S. Department of Defense Military Standard 883C Method 2010.7. As illustrated in FIGS. 2 and 3, the configuration of preferred semiconductor chip package 20 comprises top surface 22 defining a recessed chip carrying cavity 26, with top surface 22 having a peripheral double row of staggered package bond pads configured on a single tier.

A method of manufacturing a semiconductor chip package for carrying a semiconductor is provided comprising the steps of providing a semiconductor chip package with a central chip receiving area and arranging a double row of staggered single tier bonding pads on the package around the central chip receiving area. The method may further comprise the steps of placing a chip having chip bonding pads in the central chip receiving area and connecting uniformly lengthed electrically conductive wires between the chip bonding pads and the package bonding pads without crossing any two or more wires.

Similarly, the present high density bond pad invention includes a method for providing a semiconductor chip package having a high-density single-tier bond pad configuration which meets the wire crossing prohibition of U.S. Department of Defense Military Standard 883C Method 2010.7. The method preferably comprises the steps of providing a semiconductor chip package with a central chip receiving area and arranging a double row of staggered single-tier bonding pads on the package around the central chip receiving area to provide an effective pitch spacing of about 3 mils between adjacent bond pads. Further steps may include placing a chip having chip bonding pads in the central chip receiving area and connecting uniformly lengthed electrically conductive wires between the chip bonding pads and the package bonding pads without crossing any of the wires.

Yet another method of bonding a semiconductor chip to a semiconductor chip package according to the present high density bond pad invention comprises the steps of providing a semiconductor chip package having a top surface which defines a central chip receiving area, arranging at least two rows of staggered single-tier bonding pads on the package top surface peripherally around the central chip receiving area so that the spacing of the package bonding pads will correspond with the spacing of particular chip bonding pads, placing a semiconductor chip having chip bonding pads in the central chip receiving area, and connecting uniformly lengthed electrically conductive wires between the chip bonding pads and the package bonding pads.

FIG. 4 illustrates a semiconductor chip package 20 comprising a top surface 22 defining a chip carrying cavity 26 formed by side walls 60 surrounding the sides of a die bond pad 64. FIG. 4 further illustrates a package bond pad configuration and means for precisely positioning a semiconductor chip in cavity 26 on die bond pad 64 prior to wire bonding electrical connections between the chip pads and the package pads.

Figure 5:
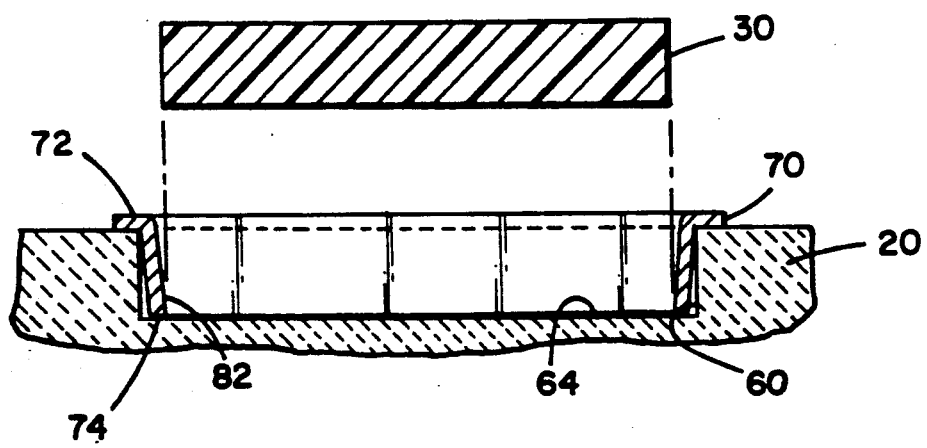
FIG. 5 is a side cross sectional view of a semiconductor chip package with a drop-through die bond frame positioned in the package die bond region and configured to receive and guide a semiconductor chip into predetermined position in the package die bond region.
Figure 6:
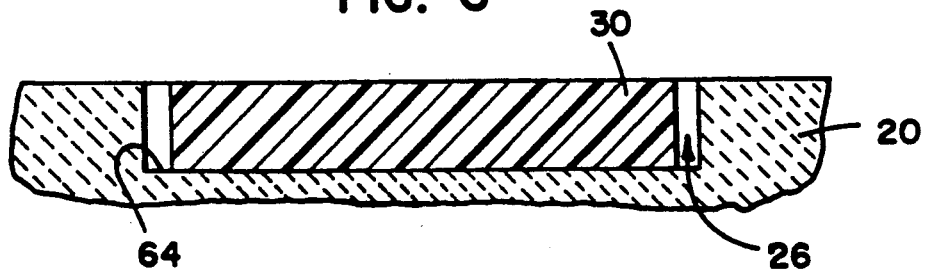
FIG. 6 is a side cross sectional view illustrating a semiconductor chip precisely positioned in a package die bond region.

Prior art means for positioning chips into package cavities include mechanical grippers or collets which often resulted in cracked or damaged chips. Also, use of prior art chip placement mechanisms frequently resulted in the problem of excess die bonding material or rosin seeping out from between the chip and the package die bond pad, resulting in aesthetic and electrical degradation to the assembled device. FIG. 4 therefore discloses a drop-through die bond frame 70 for accurately positioning a semiconductor chip onto a die bond pad region of a semiconductor package. Frame 70 comprises top and bottom surfaces, 72 and 74 respectively, an outer section 78, and an inner section 80. Preferred frame 70 outer section 78 is constructed and arranged for substantially slidable contact or fit with peripheral walls 60 of package cavity 26, as shown in FIG. 5, while inner section 80 defines at least one aperture, preferably a central aperture, extending through the frame as shown in FIGS. 4 and 5. Frame inner section 80 comprises means 82 for guiding a semiconductor chip into a precise position with respect to the package die cavity 26 when frame 70 is placed in die cavity 26 and a chip 30 is dropped through the frame central aperture. Means for guiding 82 may comprise frame inner walls 82, which are preferably sloped walls to define an upper opening at frame top surface 72 and a narrower lower opening at frame lower surface 74 for precise chip positioning into cavity 26 as depicted in FIG. 6.

Preferred drop-through die bond frame 70 thus provides rapid means for aligning and placing a semiconductor chip onto a die bond pad of a semiconductor chip carrying package. Precise chip placement is particularly important when preparing packages comprising high density or fine pitch bonding requirements. Frame 70 thus provides efficient and accurate chip placement in package die bond regions independent of chip damage and without forcing excess bonding material from beneath the chip as occurs during conventional scrubbing. Preferred frame 70 comprises material which is non-wettable by solder, for example, aluminum, hardened rubber, and the like. Therefore, frame 70 is particularly well suited for use with low temperature or soft solder bonding material. Indeed, such material provides optimal stress relief during die bonding and may be efficiently bonded in heating facilities such as low temperature furnaces. By also providing furnaces with nitrogen atmospheres, the need for flux is eliminated along with the scrubbing requirements prevalent with prior art die bonding. Therefore, yield losses are reduced significantly during the die bonding stage of package assembly.

A low cost high throughput method of die bonding a semiconductor chip to a package die bond pad is provided according to this drop-through die bond frame invention. The method comprises the steps of providing a semiconductor chip package having a chip mounting cavity configured with a die bond pad, providing bonding material located on the die bond pad, and placing a non-wettable frame into the package cavity, the frame comprising top and bottom surfaces and an outer section comprising means or surfaces for achieving substantially slidable contact with peripheral walls of the package cavity, the frame inner section defining a central aperture extending through the frame, and the inner section comprising sloped walls defining a wide upper opening and a narrower lower opening. The method further comprises the steps of placing the semiconductor chip through the frame aperture into contact with the die bond pad bonding material, and heating the bonding material. It is appreciated that variously sized semiconductor chips may be utilized in the above-described method, and that larger sized chips may require different bonding material than smaller chips to achieve adequate bonding with die bond pads. Accordingly, the above method comprises providing bonding material comprising non-organic bonding material. The above method also comprises providing bonding material comprising solder bonding material.

Another method of die bonding according to the drop-through die bond frame invention is provided comprising the steps of providing a semiconductor chip package having a chip mounting cavity configured with a die bond pad, providing bonding material located at the die bond pad, placing a non-wettable frame having at least one aperture into the package cavity, placing the semiconductor chip through the selected aperture into contact with the die bond bonding material, and heating the bonding material to bond the chip to the package.

Yet another low cost method for bonding a semiconductor chip to a semiconductor package die bond pad is provided. This low cost non-organic method comprises the steps of providing a semiconductor chip package having a chip mounting cavity comprising walls surrounding a die bond pad and non-organic bonding material located on the bonding pad, placing a non-wettable frame having a central aperture into slidable contact with walls of the package cavity, orienting a semiconductor chip to the aperture of the frame, placing the semiconductor chip through the frame aperture into contact with the bonding material on the die bond pad, and then heating the bonding material to bond the chip to the die bond pad. The step of bonding non-organic bonding material in this method comprises providing solder bonding material. Also, the step comprising providing a package with a semiconductor chip cavity comprises providing a package having a semiconductor chip cavity sized for receipt of a semiconductor chip having a side length greater than about 400 mil.

Although mechanical structural means may be utilized for precisely positioning a semiconductor chip onto a chip package bond pad region, such means being non-integral to the package, it is possible to achieve precise chip positioning through use of integral package structures. Indeed, as illustrated in FIGS. 7-14, and detailed further herein, a semiconductor chip package 20 is provided comprising a die bond pad region 26 and means for controlling in die bond pad region 26 a wetted area of molten solder to a predetermined area size and for positioning to a predetermined location a chip of predetermined size placed on the solder. In FIGS. 7-10, the means for controlling comprises a ridge 96 of material which dams the area over which molten solder patterns itself on bond pad region 26.

FIG. 8 is a side cross-sectional view corresponding generally to lines 8—8 of FIG. 7 in which ridge 96 is shown configured for containing molten solder within a predetermined area size defined by the length and width of the ridge. FIG. 9 further illustrates semiconductor chip package 20 with solder 100 contained within ridge 96 and with a representative semiconductor chip 30 shown in aligned contact with solder 100. By providing means for controlling in the die bond pad region a wetted area of molten solder to a predetermined area size, then a semiconductor chip may be positioned to a predetermined location using surface tension properties of the molten solder. Thus, when a semiconductor chip, such as chip 30, is placed into contact with molten solder the solder will act to reposition the chip so as to provide the lowest energy state of contact. This results in automatic repositioning and alignment due to the reflow properties of the molten solder acting on the chip surface in contact with the solder. As shown in FIG. 10, chip 30 has been placed into contact with a predetermined area size of molten solder in a misaligned orientation. Ridge 96 functions to control the reflow area of molten solder 100. This restraining or damming of molten solder 100 results in repositioning forces, represented by motion arrows in bold, being applied to chip 30 so as to reposition the chip into alignment within the area defined by ridge 96 and solder 100. Ridge 96 may be formed by various processes, although ridge 96 formed of screened ceramic is preferable.

Figure 11:
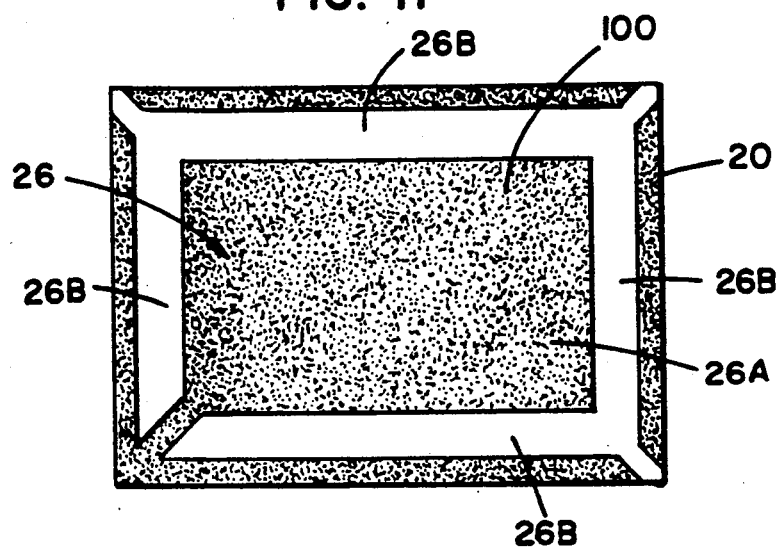
FIG. 11 is a top plan view of a semiconductor chip package having a chip mounting region comprising a wettable die bond pad surrounded by an area of non-wettable material.

In addition to providing ridge means for controlling the area, size, and flow of molten solder 100, alternate means may be utilized. For example, as shown in FIG. 11, the means for controlling in die bond pad region 26 a wetted area of molten solder 100 to a predetermined area size comprises an area of wettable material 26A substantially surrounded by an area of non-wettable material 26B.

Figure 12:
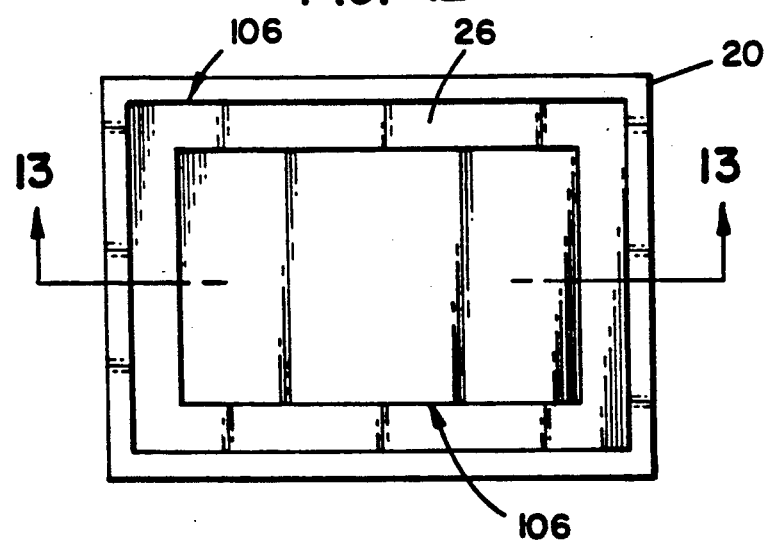
FIG. 12 is a top plan view of a semiconductor chip package having a die bond pad region comprising means for controlling a wetted area of molten solder to a predetermined area size comprising a recess located in the die bond pad region.
Figure 13:
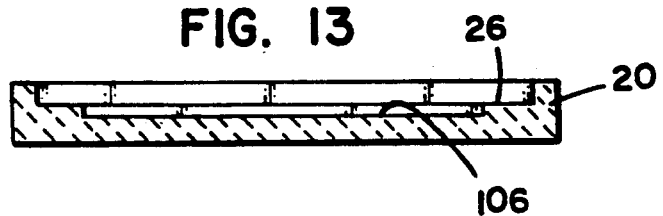
FIG. 13 is a side cross sectional view corresponding generally to lines 13—13 in FIG. 12.
Figure 14:
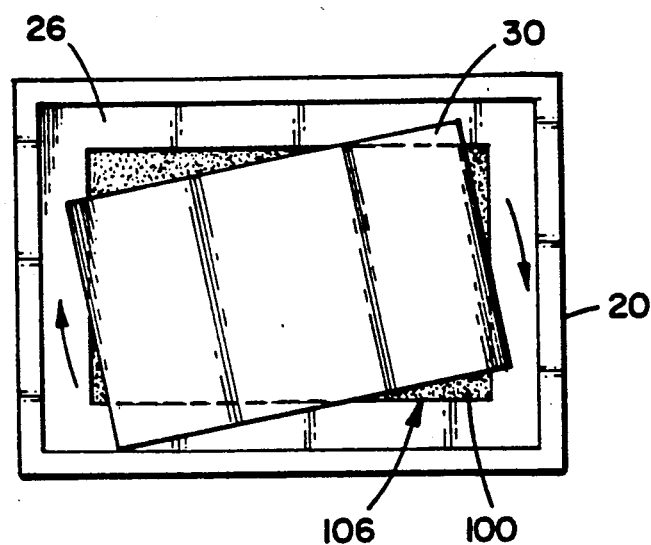
FIG. 14 is a top plan view illustrating a misaligned semiconductor chip being aligned by the surface tension of the solder material located within the die bond pad region recess in a semiconductor chip package generally analogous to that shown in FIGS. 12-13.

Yet another means for controlling in die bond pad region 26 a wetted area of molten solder 100 to a predetermined area size comprises a recessed portion 106 of bonding pad region 26. As illustrated in FIGS. 12-14, recessed portion 106 of bonding pad region 26 provides means for controlling molten solder to a predetermined area size. As earlier described, this control of the molten solder allows for reflow positioning of a semiconductor chip 30, shown in FIG. 14, to an aligned position relative to die bond pad region 26 with great precision.

Heretofore, precise positioning of a semiconductor chip into a die bond pad region has been normally accomplished with only great relative difficulty and by use of structural means not integral to the semiconductor chip package. Thus, a semiconductor chip package according to the present reflow control die bond positioning system invention provides for improved means for precisely positioning a semiconductor chip to a predetermined location in a semiconductor chip package.

A method of manufacturing a semiconductor chip package for providing low cost die bonding of a semiconductor chip is provided. This method comprises the steps of providing a semiconductor chip package having a chip mounting region comprising a die bond pad and a ridge of material surrounding the die bond pad for damming molten solder, placing solder bonding material onto the die bond pad, and placing a semiconductor chip onto the chip mounting region solder bonding material. The method further includes the steps of heating the solder bonding material to a molten state, and permitting the surface tension of the molten solder to position the chip to a predetermined location. The solder bonding material may be either preformed or non-preformed solder bonding material. Additionally, the step of placing solder bonding material onto the die bond pad may be replaced by the step of placing a semiconductor chip comprising solder bonding material onto the chip mounting region die bond pad. The above method may be altered by providing a semiconductor chip package having at least one chip mounting region comprising a wettable die bond pad surrounded by an area of non-wettable material, or by providing a semiconductor chip package having at least one chip mounting region comprising a recessed portion for retaining molten solder.

The invention accordingly consists in the features of the construction, combinations of elements, arrangements of parts, and methods of manufacture which will be exemplified in the construction and methods described above and of which the scope of the invention would be indicated in the following claims. It is to be understood that while certain embodiments of the present invention have been illustrated and described, the invention is not to be limited to the specific forms or arrangements of parts herein described and shown.

We claim:

1. A removable drop-through die bond frame for accurately positioning a semiconductor chip onto a die bond pad region of a semiconductor package, the frame comprising top and bottom surfaces, an outer section comprising means for achieving substantially slidable contact with peripheral walls of a semiconductor package die cavity, and an inner section defining a central aperture extending through the frame, the inner section comprising means for guiding a semiconductor chip into a precise position with respect to the package die cavity when the frame is placed in the die cavity and the semiconductor chip is dropped through the frame central aperture, the outer section further comprising means for permitting removal of the frame from the package die cavity after the semiconductor chip has been precisely positioned by the frame.

2. The frame according to claim 1 wherein the means for guiding a semiconductor chip comprises sloped walls defining a wide upper opening and a narrower lower opening.

3. The frame according to claim 2 wherein the frame comprises material non-wettable by solder.

4. The frame according claim 3 wherein the non-wettable material comprises aluminum.

5. The frame according to claim 3 wherein the non-wettable material comprises hardened rubber.

6. A removable drop-through die bond frame for positioning a semiconductor chip onto a die bond pad of a semiconductor package, comprising:
   a) a frame member having an outer section and an inner section, the inner section having walls defining a central aperture;
   b) the outer section of the frame comprising means for achieving a substantially slidable fit with walls of a semiconductor package cavity surrounding a die bond pad;
   c) the walls of the inner section of the frame being sloped for guiding the placement of a semiconductor chip into a precise location on the die bond pad when the frame is positioned within a semiconductor package cavity and a semiconductor chip is dropped through the frame central aperture; and
   d) the outer section of the frame further comprising means for permitting removal of the frame from the semiconductor package cavity after the semiconductor chip has been positioned by the frame.

7. The frame according to claim 6 wherein the frame comprises aluminum.

8. The frame according to claim 6 wherein the frame comprises hardened rubber.

* * * * *